(12) United States Patent
Bunce et al.

(10) Patent No.: US 7,266,737 B2
(45) Date of Patent: Sep. 4, 2007

(54) METHOD FOR ENABLING SCAN OF DEFECTIVE RAM PRIOR TO REPAIR

(75) Inventors: Paul A. Bunce, Poughkeepsie, NY (US); John D. Davis, Wallkill, NY (US); Patrick J. Meaney, Poughkeepsie, NY (US); Donald W. Plass, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 231 days.

(21) Appl. No.: 11/180,416

(22) Filed: Jul. 13, 2005

(65) Prior Publication Data

US 2007/0033459 A1 Feb. 8, 2007

(51) Int. Cl.
G11C 29/00 (2006.01)
(52) U.S. Cl. .............. 714/711; 714/718; 714/726; 714/733; 365/201
(58) Field of Classification Search .............. 365/200, 365/201; 714/711, 718, 733
See application file for complete search history.

(56) References Cited

U.S. PATENT DOCUMENTS

| | | | | |
|---|---|---|---|---|
| 6,333,878 B2 * | 12/2001 | Ooishi | .............. | 365/200 |
| 6,366,508 B1 * | 4/2002 | Agrawal et al. | .............. | 365/200 |
| 6,496,427 B2 * | 12/2002 | Kojima et al. | .............. | 365/200 |
| 6,505,313 B1 * | 1/2003 | Phan et al. | .............. | 714/718 |
| 6,507,524 B1 * | 1/2003 | Agrawal et al. | .............. | 365/200 |

\* cited by examiner

Primary Examiner—David Ton
(74) Attorney, Agent, or Firm—Lynn L. Augspurger

(57) ABSTRACT

A semiconductor memory circuit enabling replacement of defective memory elements and associated circuitry with non-defective spare elements of the RAM and associated circuitry, is scanned to enable replacement of a defective RAM element prior to repair of the RAM. A set of set/reset latches are coupled to receive the signal from the memory elements, and a multiplexer control circuit coupled to receive a shift signal and a ram_inhibit signal from a multiplexer to provide specific input signals to the multiplexer components. When a scan operation begins an active clock signal sets a set/reset latch to ram_inhibit mode and this blocks the memory elements from influencing the state of memory output latches, whereby when an memory operation begins, an active clocking signal will reset the set/reset latch into system mode to cause the multiplexers pass appropriate signals from the memory elements to the output latches, and the spare memory element is activated to replace a defective memory element.

19 Claims, 2 Drawing Sheets

METHOD FOR ENABLING SCAN OF DEFECTIVE RAM PRIOR TO REPAIR

IBM ® is a registered trademark of International Business Machines Corporation, Armonk, N.Y., U.S.A. Other names used herein may be registered trademarks, trademarks or product names of International Business Machines Corporation or other companies.

BACKGROUND OF THE INVENTION

1. Field of the Invention

This invention relates to semiconductor memory design and particularly to skip-over redundancy repair operations.

2. Description of Background

Skip-over redundancy is a method used in semiconductor memory design at IBM to replace certain defective memory elements and associated circuitry with non-defective spare elements and associated circuitry. The method involves several stages of chip testing. One of the early stages of chip test includes a "scan" test which tests some of the basic test infrastructure built into the chip. If a chip does not pass this basic test, it is considered a non-repairable defective chip. If the chip passes the scan test testing will continue. Later in the test sequence, the memory elements and associated circuitry are tested. If a defective element is found and it is determined that the element can be repaired with a spare element via the skip-over redundancy scheme, the repair will be made and the memory retested.

Scan operations are an integral part of both chip testing and redundancy repair actions. These operations are used to read the current state of chip latches and to load information into chip latches. Some of the latches that can be loaded hold the information needed to repair defective memory elements and associated circuitry. Certain manufacturing defects in memory elements can cause the chip to fail basic scan operations. Some of these defects can be in elements and/or circuitry that are repairable using redundancy; however since the chip cannot complete scan operations the chip never reaches that part particular step in the test/repair sequence. These defects may therefore be repairable defects, that once repaired, would also permit the scan operation to continue, but since they cause the chip to fail the "scan" operation, they are never tested or repaired, resulting in a loss of chip yield

SUMMARY OF THE INVENTION

The shortcomings of the current example are overcome and additional advantages are provided through the provision of a method for enabling scan operations on chips with certain repairable defects. This invention provides a method, which can be provided as a manufacturing or repair service in the plant or in the field, to isolate the defective memory elements and associated circuitry from the circuitry used to implement the scan operation while the chip is in scan mode. This enables the scan operation to be performed on the chip without failing due to potentially repairable memory element defects. This can be done in the process of manufacturing, or by scan operations performed during field service test. Thus, using such testing some of the defects in elements and/or circuitry that are repairable using redundancy; may therefore be repairable defects, that once repaired, also permit the scan operation to continue.

Additional features and advantages are realized through the techniques of the present invention. Other embodiments and aspects of the invention are described in detail herein and are considered a part of the claimed invention. For a better understanding of the invention with advantages and features, refer to the description and to the drawings.

Technical Effects

As a result of the summarized invention, technically we have achieved a solution which potentially enhances chip yield. This effect is the result of enabling chip scan operations to complete on chips that would otherwise have been classified as defective due to scan operation failures. Enabling the scan operation of these chips permits further testing and possible repair of memory elements. A chip without this invention would have been classified as defective, regardless of if it were repairable of not.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiment of the invention, together with advantages and features, by way of example with reference to the drawings.

DETAILED DESCRIPTION OF THE INVENTION

Figure 1:
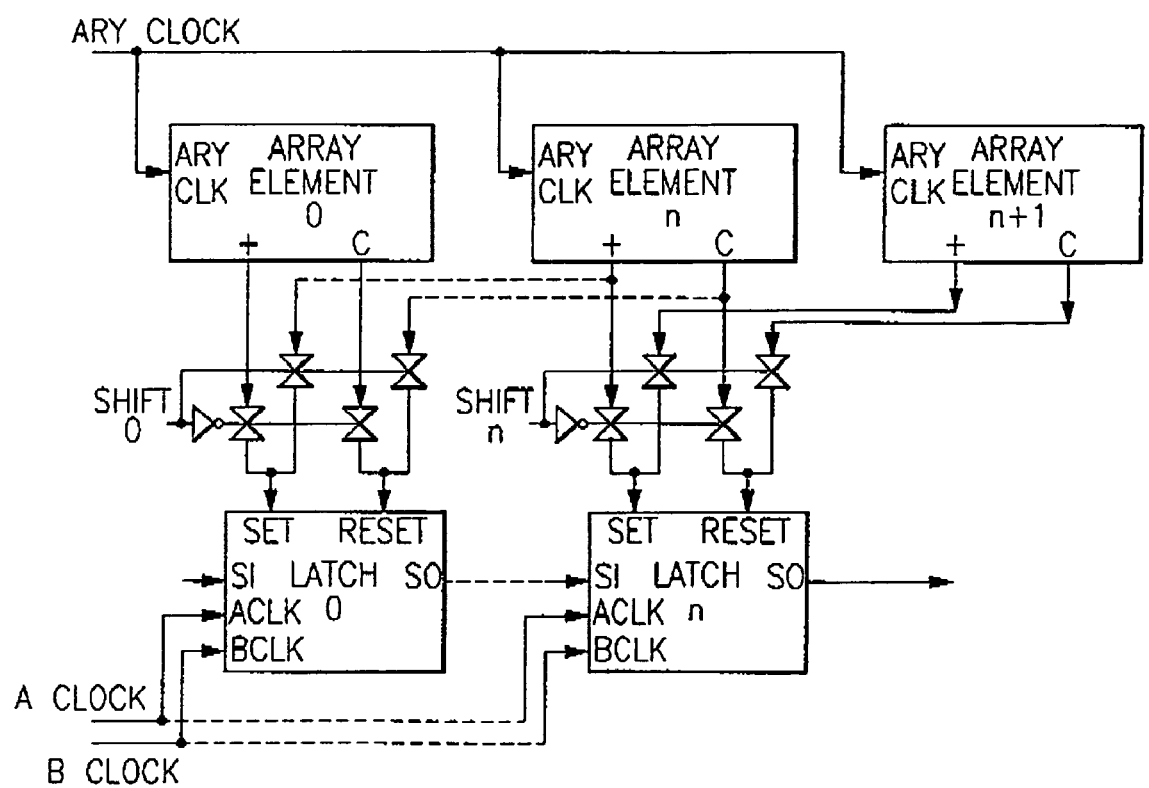
FIG. 1 illustrates one example of a semiconductor memory using skip-over redundancy which currently, when a memory chip scan fails because the chip is defective, does not achieve the results of a preferred embodiment unless the preferred embodiment is employed.
Figure 2:
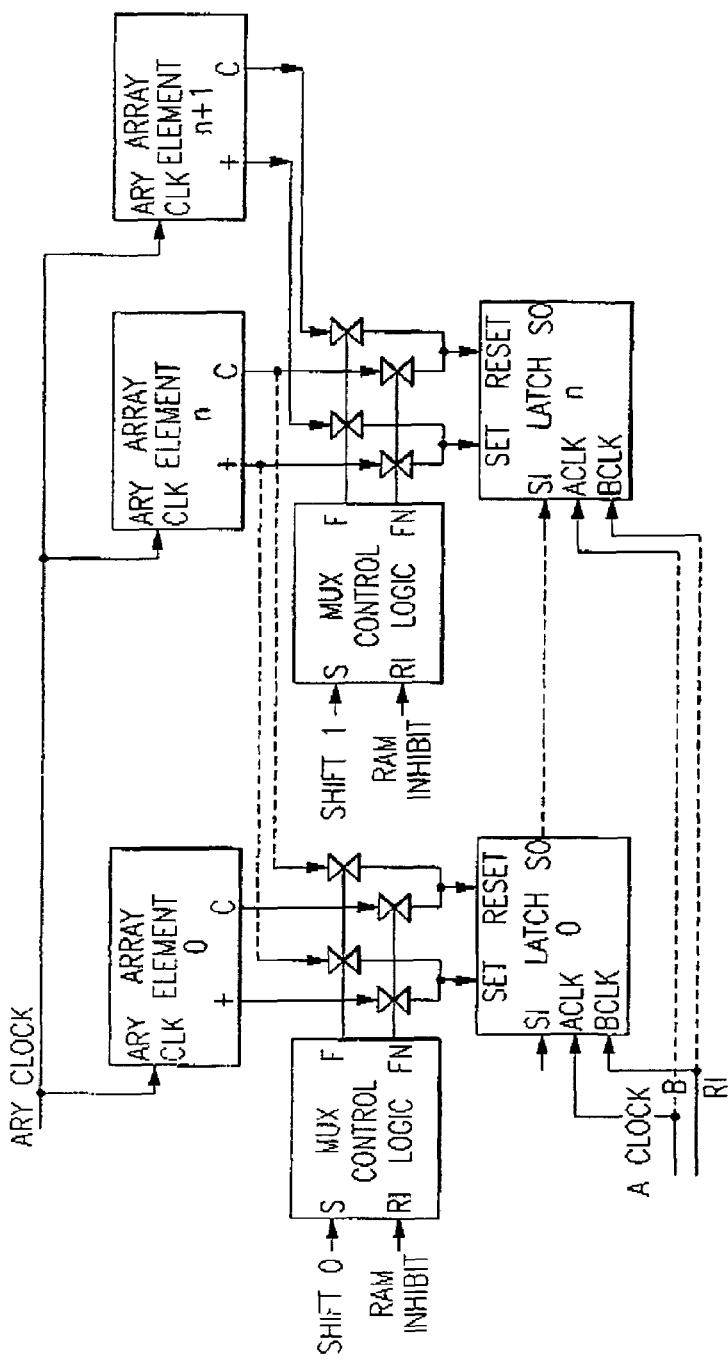
FIG. 2 illustrates a preferred embodiment of the invention.

Turning now to the drawings in greater detail, as we said, FIG. 1 does not achieve the results of the embodiment illustrated in FIG. 2, but rather, FIG. 1 is an example of the read portion of a semiconductor memory implemented using a skip-over redundancy scheme. In this FIG. 1 there are n memory elements, n multiplexers, and n latches. There is also a spare memory element on the right side bringing the total number of memory elements to n+1. The multiplexers are designed such that if the associated shift signal is inactive, the multiplexer will pass the data from the associated memory element to the associated latch, if the shift signal is active the multiplexer passes data from the memory element to the right of the associated multiplexer to the associated latch. In this example the multiplexers are designed using transmission gates. The first transmission gate receives data from the associated memory element, and the second transmission gate receives data from the memory element to the right of the associated multiplexer. The logic to control these transmission gates is an inverter. The second transmission gate receives shift and the first transmission gate receives shift_not If all the shift inputs are set to binary 0 each of the n memory elements feed a corresponding latch and the spare element (n+1) is not used. If a defective memory element is found the shift input corresponding to the defective element is raised to a binary 1 along with all shift elements to the right of the defective element. This causes each mux beginning with the mux associated with the defective element through the last mux (n) to select data from the memory element to the right. The overall effect is that the defective memory element is skipped over and the spare element is used.

The operation describe for FIG. 1 uses scanable set-reset latches. The operation of these latches is such that an active signal on the set input will force the latch into a set state (binary 1 state), while an active signal on the re-set input will force the latch to a reset state (binary 0). The absence of an active signal on either set or reset means the latch will not be forced into either a set or reset state, rather it will remain in it's current state. It will be understood by those skilled in the art that there are various possible implementations of such a scanable set/reset latch. Multiple latches strung together; scan out (so) to scan in (si) form a scan chain. Data is shifted through the scan chain by a repeated sequence of active a-clock and b-clock signals. These latches and their operation should be known to one skilled in the art. In FIG. 1, it can be seen that each latch set and re-set pin is sourced from a multiplexer that is in-turn sourced from ether a t or c pin of a memory element. Each memory element is designed to provide an inactive t or c signal whenever the ary-clock signal is inactive. Thus the inactive ary-clock signal permits the latch to either hold it's current state, or be updated via a scan operation (a-clock/b-clock sequence). If a defect in a memory element exists such that it produces an active signal on either or both the t and c pins, this active signal will result in an active set and or re-set signal to a latch. This active signal will force the latch to either a binary 1 (set) or a binary 0 (re-set) or an unknown state (both set and re-set active). After having explained FIG. 1, it will be appreciated that if a scan operation is attempted while an active signal is present on either or both the set and or re-set pins of the latch, the scan operation will fail. The operation can fail for several reasons; the scan operation cannot write the latch, the scan operation successfully writes the latch but when the operation ends the set or re-set operation overwrites the latch with new data. In either case the result is that the scan operation fails and thus certain manufacturing defects in memory elements can cause the chip to fail basic scan operations. Some of these defects can be in elements and/or circuitry that are repairable using redundancy; however since the chip cannot complete scan operations the chip never reaches that part particular step in the test/repair sequence. These defects may therefore be repairable defects, that once repaired, would also permit the scan operation to continue, but since they cause the chip to fail the "scan" operation, they are never tested or repaired, resulting in a loss of chip yield.

However, this need not be the case when a preferred embodiment of our invention illustrated by FIG. 2 is employed. In FIG. 2 we see a new control method for the multiplexers. In this FIG. 2 the multiplexers coupled for control by a mux control logic block. In this FIG. 2 the first transmission gate receives the fn output of the mux control block and the second transmission gate receives the f output of the transmission gate. The mux control block receives two signals, a shift signal and a ram_inhibit signal.

Table 1 shows the relationship between the input signals and the output signals of the mux control block. It can be seen from Table 1 that if the ram_inhibit signal is inactive (binary 0), then the binary output values f and fn sent to the transmission gate muxes will match the shift and shif_not signal sent to the transmission gate muxes in FIG. 1. Hence if the ram_inhibit signal is inactive (binary 0), then the functionality of the circuitry in FIG. 2 will match the functionality of FIG. 1. If the ram_inhibit signal is a active (binary 1), then as described in Table 1, the binary output signals f and fn will both be inactive (binary 0). In this state both transmission gates comprising the mux will be inactive and the latch element will be unable to receive an active set or reset signal from either the associated memory element or from the memory element to the right of the associated memory element.

In this way any defect in the memory element that would have sent an erroneous set or reset signal to the latch is blocked from doing so. In summary if the ram_inhibit signal is inactive (binary 0) the multiplexers pass the appropriate signals from the memory elements to the memory output latches while providing the shifting functions needed for the skipover redundancy scheme. If the ram_inhibit signal is active (binary 1), the multiplexers block or isolate the memory elements from influencing the output latch states.

Turning now to the lower portion of FIG. 2, we see how the ram_inhibit signal is generated for this particular embodiment. In this example the ram_inhibit signal is the output of a non-scanable set/reset latch. The set input to this latch is a-clock, while the reset input is aryclk. In this case the a-clock signal is a scan clock. At the beginning of a scan operation this signal would become active. As the scan operation proceeds the state of this signal would vary between active and inactive. It can be seen in FIG. 2 that an active state (binary 1) on the a-clock input to the set/reset latch that provides the ram_inhibit signal would set the ram_inhibit signal active (binary 1). This in turn would block/isolate the memory elements from influencing the output latch states. The aryclk signal is a system clock which is by design never active during a scan operation. An active state on this signal signifies an access operation to the semiconductor memory. Since the aryclk feeds the reset pin of the set/reset latch that provides the ram_inhibit signal, it can be seen that an active state on the aryclk signal (binary 1) will reset the latch and set the ram_inhibit signal to an inactive state (binary 0). This in turn will set the inputs to the mutiplexers to the states required to pass data from the memory elements to the output latches.

In summary, when a scan operation begins, an active a-clock signal will set a set/reset latch to ram_inhibit mode (binary 1 output). In this mode the memory elements are blocked from influencing the state of the output latches. When an memory operation begins, an active aryclk signal will reset the set/reset latch in to system mode (binary 0 output). In this mode the multiplexers pass the appropriate signals from the memory elements to the output latches.

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A semiconductor memory circuit enabling replacement of defective memory elements and associated circuitry with non-defective spare elements and associated circuitry, comprising:
   a semiconductor memory having a set of memory elements and at least one spare element,
   a multiplexer which is coupled to provide a signal from one or more of said set of memory elements or provide to or block said signals entirely from said memory elements, and
   a set of set/reset latches coupled to receive the signal from the memory elements, and a multiplexer control circuit for receiving a shift signal and a ram_inhibit signal and coupled to said multiplexer to provides specific input signals to the multiplexer components.

2. The semiconductor memory circuit according to claim 1, further including a set/reset latch that receives a scan clock signal and a system clock signal to determine if the chip is in scan mode or system mode.

3. The semiconductor memory circuit according to claim 2, wherein said set/reset latch that receives a scan clock signal and a system clock signal provides an ram_inhibit signal.

4. The semiconductor memory circuit according to claim 3, wherein there are a plurality of n multiplexers coupled for control by a multiplexer control circuit, and said multiplexers have a first transmission gate which receives an fn output of the multiplexer control circuit and the second transmission gate receives the f output of the second transmission gate, such that the multiplexer control circuit receives two signals, a shift signal and a ram_inhibit signal.

5. The semiconductor memory circuit according to claim 4, wherein there are n memory elements for said n multiplexers, and n latches as well as a spare memory element bringing the total number of memory elements to n+1, and wherein if the associated shift signal is inactive active the multiplexer control circuit will pass the data from the associated memory element to the associated latch, and if the shift signal is active the multiplexer passes data from the spare memory element to the associated latch.

6. The semiconductor memory circuit according to claim 5, wherein summary when said ram_inhibit signal is inactive the multiplexers pass appropriate signals from the memory elements to memory output latches while providing the shifting functions needed for a skipover redundancy scheme, and when said ram_inhibit signal is active, the multiplexers block or isolate the memory elements from influencing the states of said output latches.

7. The semiconductor memory circuit according to claim 6, wherein when a scan operation begins, an active clock signal will set a set/reset latch to ram_inhibit mode and then said memory elements are blocked from influencing the state of the output latches, and when an memory operation begins, an active clocking signal will reset the set/reset latch into system mode to cause the multiplexers pass appropriate signals from the memory elements to the output latches.

8. A method for testing a semiconductor computer memory circuit, comprising he steps of:
   scanning a semiconductor memory circuit enabling replacement of defective memory elements and associated circuitry with non-defective spare elements and associated circuitry, said a semiconductor memory having a set of memory elements and at least one spare element, and a multiplexer which is coupled to provide a signal from one or more of said set of memory elements or provide to or block said signals entirely from said memory elements, and
   a set of set/reset latches coupled to receive the signal from the memory elements, and a multiplexer control circuit for receiving a shift signal and a ram_inhibit signal and coupled to said multiplexer to provides specific input signals to the multiplexer components, and
   when a scan operation begins, settting with an active clock signal a set/reset latch to ram_inhibit mode and then blocking said memory elements are blocked from influencing the state of memory output latches, whereby when an memory operation begins, an active clocking signal will reset the set/reset latch into system mode to cause the multiplexers pass appropriate signals from the memory elements to the output latches.

9. The method according to claim 8, further including a set/reset latch that receives a scan clock signal and a system clock signal to determine if the chip is in scan mode or system mode.

10. The method according to claim 9, wherein said set/reset latch that receives a scan clock signal and a system clock signal provides an ram_inhibit signal.

11. The method according to claim 10, wherein there are a plurality of n multiplexers coupled for control by a multiplexer control circuit, and said multiplexers have a first transmission gate which receives an fn output of the multiplexer control circuit and the second transmission gate receives the f output of the second transmission gate, such that the multiplexer control circuit receives two signals, a shift signal and a ram_inhibit signal.

12. The method according to claim 11, wherein there are n memory elements for said n multiplexers, and n latches as well as a spare memory element bringing the total number of memory elements to n+1, and wherein if the associated shift signal is inactive active the multiplexer control circuit will pass the data from the associated memory element to the associated latch, and if the shift signal is active the multiplexer passes data from the spare memory element to the associated latch.

13. The method according to claim 12, wherein summary when said ram_inhibit signal is inactive the multiplexers pass appropriate signals from the memory elements to memory output latches while providing the shifting functions needed for a skipover redundancy scheme, and when said ram_inhibit signal is active, the multiplexers block or isolate the memory elements from influencing the states of said output latches.

14. A service for testing a semiconductor computer memory circuit, comprising the steps of:
   scanning a semiconductor memory circuit enabling replacement of defective memory elements and associated circuitry with non-defective spare elements and associated circuitry, said a semiconductor memory having a set of memory elements and at least one spare element, and a multiplexer which is coupled to provide a signal from one or more of said set of memory elements or provide to or block said signals entirely from said memory elements, and
   a set of set/reset latches coupled to receive the signal from the memory elements, and a multiplexer control circuit for receiving a shift signal and a ram_inhibit signal and coupled to said multiplexer to provides specific input signals to the multiplexer components, and when a scan operation begins, setting with an active clock signal a set/reset latch to ram_inhibit mode and then blocking said memory elements are blocked from influencing the state of memory output latches, whereby when an memory operation begins, an active clocking signal will reset the set/reset latch into system mode to cause the multiplexers pass appropriate signals from the memory elements to the output latches, and activating a spare memory element to replace a defective memory element.

15. The method according to claim 14, further including a set/reset latch that receives a scan clock signal and a system clock signal to determine if the chip is in scan mode or system mode.

16. The method according to claim 15, wherein said set/reset latch that receives a scan clock signal and a system clock signal provides an ram_inhibit signal.

17. The method according to claim 16, wherein there are a plurality of n multiplexers coupled for control by a multiplexer control circuit, and said multiplexers have a first transmission gate which receives an fn output of the multiplexer control circuit and the second transmission gate receives the f output of the second transmission gate, such that the multiplexer control circuit receives two signals, a shift signal and a ram_inhibit signal.

18. The method according to claim 17, wherein there are n memory elements for said n multiplexers, and n latches as well as a spare memory element bringing the total number of memory elements to n+1, and wherein if the associated shift signal is inactive active the multiplexer control circuit will pass the data from the associated memory element to the associated latch, and if the shift signal is active the multiplexer passes data from the spare memory element to the associated latch.

19. The method according to claim 18, wherein summary when said ram_inhibit signal is inactive the multiplexers pass appropriate signals from the memory elements to memory output latches while providing the shifting functions needed for a skipover redundancy scheme, and when said ram_inhibit signal is active, the multiplexers block or isolate the memory elements from influencing the states of said output latches.

* * * * *